United States Patent
Park

(10) Patent No.: US 8,124,438 B2
(45) Date of Patent: Feb. 28, 2012

(54) METHOD OF FABRICATING CMOS IMAGE SENSOR

(75) Inventor: Ji-Hwan Park, Chungju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 118 days.

(21) Appl. No.: 12/565,983

(22) Filed: Sep. 24, 2009

(65) Prior Publication Data

US 2010/0084695 A1    Apr. 8, 2010

(30) Foreign Application Priority Data

Oct. 6, 2008    (KR) .................. 10-2008-0097673

(51) Int. Cl.
*H01L 21/00* (2006.01)

(52) U.S. Cl. ............. 438/59; 438/403; 257/E21.334

(58) Field of Classification Search ............. 438/56–81, 438/424–453; 257/E21.334

See application file for complete search history.

(56) References Cited

U.S. PATENT DOCUMENTS

2008/0265295 A1* 10/2008 Brady ................ 257/291

* cited by examiner

*Primary Examiner* — Matthew Reames

(74) *Attorney, Agent, or Firm* — Sherr & Vaughn, PLLC

(57) ABSTRACT

A CMOS image sensor and a method of fabricating the same. The CMOS image sensor may minimize disappearance of electrons generated by light without transmission of electrons to a transfer gate. A method of manufacturing a CMOS image sensor may include forming a trench over an isolation region of a semiconductor substrate to define an active region including a photodiode region and a transistor region. The method may include forming first conductivity-type ion implanted regions over a trench side wall of a photodiode region and over a region adjacent to the transistor region. The method may include forming second conductivity-type ion implanted regions between a first conductivity-type ion implanted region and a trench, and between a lower part of a transistor region and a first conductivity-type ion implanted region. The method may include forming an isolation layer, forming a gate electrode and a spacer, and/or forming a photodiode.

14 Claims, 2 Drawing Sheets

METHOD OF FABRICATING CMOS IMAGE SENSOR

Figure 1A:
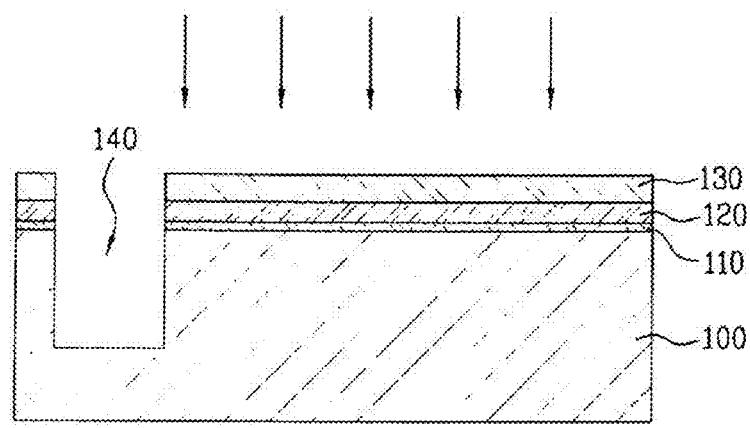

The present application claims priority under 35 U.S.C. 119 to Korean Patent Application No. 10-2008-0097673 (filed on Oct. 6, 2008) which is hereby incorporated by reference in its entirety.

BACKGROUND

Embodiments relate to an electronic device, including a CMOS image sensor. Some embodiments relate to a method of fabricating a CMOS image sensor.

Image sensors may be semiconductor devices, and may be used to change an optical image into an electrical signal. Image sensors may be categorized as a Charge Coupled Device (CCD). A CCD may have a structure in which MOS capacitors are disposed adjacent relative to each other. Charge carriers in a CCD may be stored in a MOS capacitor and may be transmitted to another MOS capacitor, for example at a rear end thereof However, a CCD may have a relatively complicated driving method, high power consumption, and/or complicated fabrication process due to several steps that may be involved in a photo process. Since it may be relatively difficult to integrate a control circuit, a signal processing circuit, and/or an A/D converter circuit into a CCD chip, a CCD may cause difficulty in product miniaturization.

An image sensor may be categorized as a Complementary Metal-Oxide-Silicon (CMOS) image sensor. Recently, a CMOS image sensor has been investigated to address one or more drawbacks related to a CCD. A CMOS image sensor may employ a switching manner, in which MOS transistors corresponding to a number of unit pixels are formed over a semiconductor substrate through a CMOS technique. A control circuit and a signal processing circuit may be used as peripheral circuits, and outputs of respective unit pixels may be sequentially detected by MOS transistors. A CMOS image sensor may form a photodiode and a MOS transistor in each unit pixel, and thus may sequentially detect electrical signals of respective unit pixels in a switching manner, thereby implementing an image.

A CMOS image sensor may use a CMOS technique, and may have a relatively low power consumption and/or simple fabrication process due to a relatively small number of steps that may be involved in a photo process. Since a control circuit, a signal processing circuit, and/or an A/D converter circuit may be integrated into a CMOS image sensor chip, a CMOS image sensor may facilitate product miniaturization. A CMOS image sensor may be widely used in various fields, such as digital still cameras and digital video cameras.

However, in a CMOS image sensor, electrons generated by light may easily disappear due to a relatively shortened life span. It may be difficult to transmit electrons generated from relatively deep inside of a photodiode, for example to a transfer gate. Thus, there is a need for a CMOS image sensor, and/or a method of fabricating a CMOS image sensor, which may minimize the disappearance of electrons generated by light without transmission of the electrons to a transfer gate.

SUMMARY

Embodiments relate to a method of fabricating a CMOS image sensor. A CMOS image sensor fabricated in accordance with embodiments may minimize the disappearance of electrons generated by light without transmission of electrons to a transfer gate.

According to embodiments, a method of fabricating a CMOS image sensor may include forming a trench over an isolation region of a substrate, including a semiconductor substrate. In embodiments, a trench formed over an isolation region of a semiconductor substrate may define an active region including, for example, a photodiode region and/or a transistor region. In embodiments, a method of fabricating a CMOS image sensor may include forming a first conductivity-type ion implanted region over a trench side wall of a photodiode region and/or over a region adjacent to a transistor region.

According to embodiments, a method of fabricating a CMOS image sensor may include forming a second conductivity-type ion implanted region. In embodiments, a second conductivity-type ion implanted region may be disposed between a first conductivity-type ion implanted region and a trench, and/or between a lower part of a transistor region and a first conductivity-type ion implanted region. In embodiments, a method of fabricating a CMOS image sensor may include forming an isolation layer by disposing an insulating film over a trench. A gate electrode and/or a spacer may be formed over a transistor region in accordance with embodiments. In embodiments, a photodiode may be formed over a photodiode region.

DRAWINGS

Example FIG. 1A to FIG. 1D are sectional views illustrating a method of fabricating a CMOS image sensor in accordance with embodiments.

DESCRIPTION

Embodiments relate to a method of fabricating a CMOS image sensor. Referring to example FIG. 1A to FIG. 1D, sectional views illustrate a method of fabricating a CMOS image sensor in accordance with embodiments. Referring to FIG. 1A, a substrate, such as semiconductor substrate 100, may be provided. In embodiments, semiconductor substrate 100 may be a high-concentration first conductivity-type substrate, for example, a $P^+$-type single-crystalline silicon substrate.

According to embodiments, a low-concentration first conductivity-type epitaxial layer may be grown over a surface of semiconductor substrate 100. In embodiments, a low-concentration first conductivity-type epitaxial layer may be a $P^-$-type epitaxial layer. In embodiments, a low-concentration first conductivity-type epitaxial layer may be grown over a surface of semiconductor substrate 100, over which a device may be formed by an epitaxial process.

According to embodiments, an epitaxial layer may enable a depletion region, for example of a photodiode, to have a relatively large size and/or great depth. In embodiments, an ability of a low-voltage photodiode to collect photo-generated charge may be enhanced, and/or properties such as light sensitivity may be improved.

According to embodiments, pad oxide film 110, pad nitride (e.g., SiN) film 120, and/or pad film 130 (e.g., TEOS) may be sequentially formed over semiconductor substrate 100. In embodiments, trench 140 may be formed over a part of an epitaxial layer for an isolation region. In embodiments, an active region, for example of a transistor, may be defined by a shallow trench isolation (STI) process through, for example, Reactive Ion Etching (RIE).

Figure 1B:
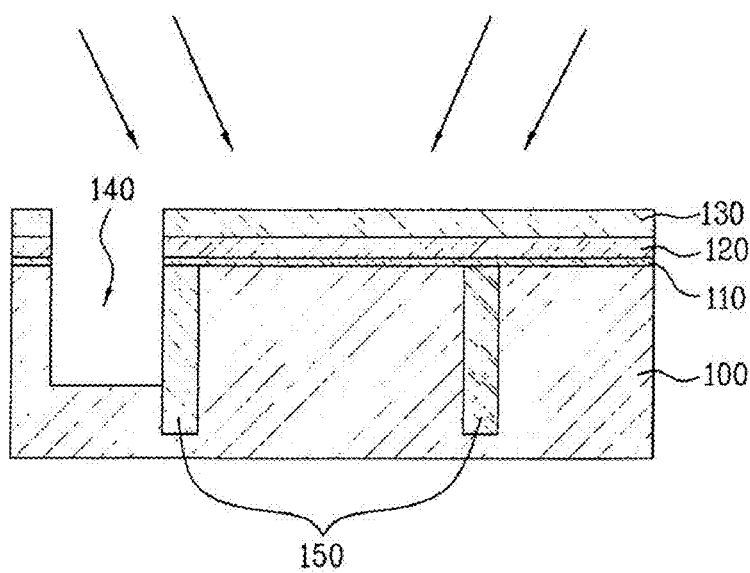

Referring to FIG. 1B, one or more N-type ion implanted regions 150 may be formed at a side wall of trench 140, for example of a photodiode region. In embodiments, N-type ion implanted regions 150 may be formed at a position below a spacer of a gate electrode. In embodiments, N-type ion implantation may be used.

According to embodiments, P⁺ ions may be used, and may be at a dose of between approximately 1E12 atoms/cm² to 5E13 atoms/cm². In embodiments, P⁺ ions including energy between approximately 50 KeV to 100 KeV may be implanted, and at a tilt of a designated angle and/or in stages. In embodiments, a four-stage ion implantation process may be used, and may relate to a technique of implanting ions having a quarter the total dose four times in four directions, for example, at 0, 90, 180, and 270 degrees, and/or while rotating semiconductor substrate 100.

Figure 1C:
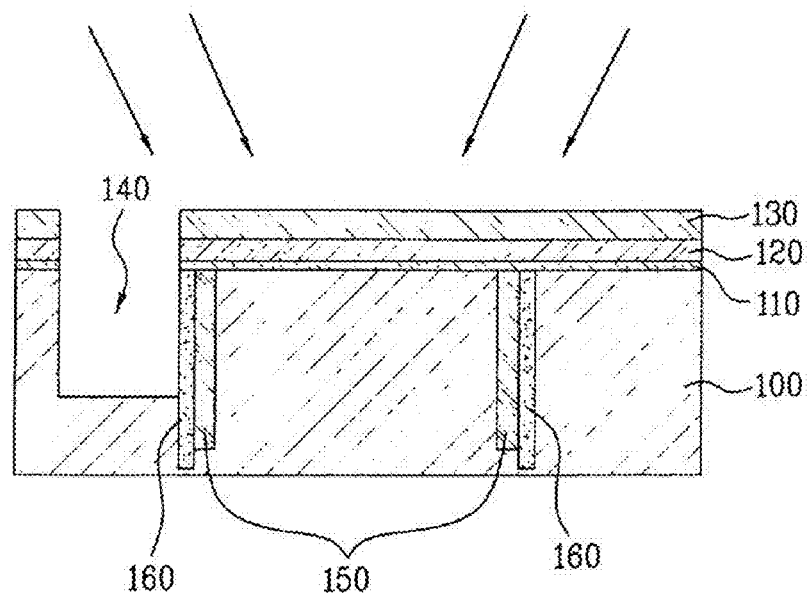

Referring to FIG. 1C, P-type ion implanted regions 160 may be formed between N-type ion implanted region 150 adjacent trench 140 and trench 140. In embodiments, P-type ion implanted regions 160 may be formed between N-type ion implanted region 150 and a channel region disposed for example below a gate electrode by P-type ion implantation. In embodiments, P-N junctions may be formed at a side wall of trench 140 and/or a side surface of a channel region, for example disposed below a transistor.

According to embodiments, P-type ion implanted regions 160 may have a greater depth relative to N-type ion implanted regions 150. In embodiments, $BF^{2+}$ ions may be implanted. In embodiments, $BF^{2+}$ ions may be implanted at a dose between approximately 5E12 atoms/cm² to 5E13 atoms/cm². In embodiments, $BF^{2+}$ ions including energy between approximately 50 KeV to 100 KeV may be implanted, and at a tilt of a designated angle and/or in stages, for example four stages.

Figure 1D:
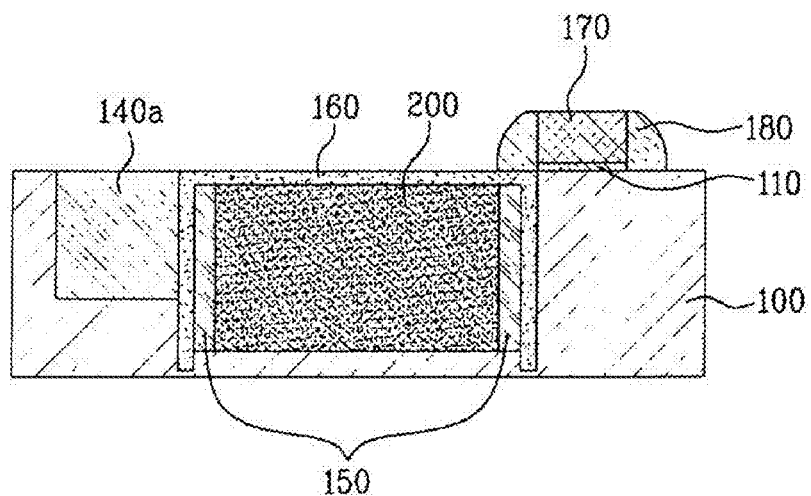

Referring to FIG. 1D, an insulating film, such as an oxide film, may be relatively deeply deposited over an upper surface of semiconductor substrate 100 including trench 140. In embodiments, an oxide film may be deposited by Chemical Vapor Deposition (CVD). In embodiments, an oxide film may substantially fill trench 140. In embodiments, isolation layer 140a may be formed by selectively etching an insulating film, pad film 130, and/or pad nitride film 120 by for example RIE, and carrying out planarization through for example a Chemical Mechanical Polishing (CMP) process.

According to embodiments, gate electrode 170 of for example a transistor may be formed. In embodiments, a surface of an active region for a photodiode region may be exposed. In embodiments, a conductive layer may be deposited over pad oxide film 110 and may be removed with pad oxide film 110 at undesired portions by etching. In embodiments, the conductive layer and/or pad oxide film 110 may remain at a region for gate electrode 170. In embodiments, a gate side wall spacer 180 may be carried out.

According to embodiments, a photoresist pattern may be formed and enable exposing an epitaxial layer over the active region for a photodiode region over semiconductor substrate 100 and mask a floating diffusion region. In embodiments, photodiode 200 may be formed by carrying out ion implantation over the epitaxial layer in an active region for the photodiode region using the photoresist pattern as an ion implantation mask. In embodiments, photodiode 200 may be formed between N-type ion implanted regions 150. In embodiments, subsequent processes may be carried out to complete the CMOS image sensor.

According to embodiments, a doping concentration of N-type ions at edges of photodiode 200 may be raised and thus resistance of photodiode 200 may be lowered. In embodiments, a relative time to easily transmit electrons may be reduced, which may be generated from relatively deep inside of photodiode 200 and/or regions distant from the transfer gate, to for example a transfer gate. In embodiments, disappearance of the electrons generated by light due to a relatively shortened life span without transmission of electrons to the transfer gate is minimized.

According to embodiments, a method of fabricating a CMOS image sensor may include a CMOS image sensor including a photodiode having relatively lowered resistance for example at edge parts thereof. A CMOS image sensor fabricated in accordance with embodiments may include a minimized time to easily transmit electrons, which may be generated from relatively deep inside of a photodiode and/or regions relatively distant from a transfer gate, to for example a transfer gate. In embodiments, disappearance of electrons generated by light due to a relatively shortened life span without transmission of electrons to a transfer gate may be minimized. In embodiments, properties may be enhanced, including relatively improved saturation and/or transmission lag.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a trench over an isolation region of a substrate to define an active region comprising a photodiode region and a transistor region;
   forming first conductivity-type ion implanted regions over a trench side wall of said photodiode region and a region adjacent to said transistor region;
   forming second conductivity-type ion implanted regions between said first conductivity-type ion implanted region and the trench and between a lower part of said transistor region and said first conductivity-type ion implanted region;
   forming an isolation layer;
   forming a gate electrode and a spacer over said transistor region; and
   forming a photodiode over said photodiode region,
   wherein each of the first conductive type ion implanted regions is in direct contact with adjoining each of the second conductive type ion implanted regions.

2. The method of claim 1, wherein:
   the substrate is a semiconductor substrate; and
   forming an isolation layer comprises filling the trench with an insulating film.

3. The method of claim 2, wherein:
   said insulating film is deposited over an entire surface of said semiconductor substrate including the trench;
   said insulating film is selectively etched; and
   said insulating film is substantially planarized through a chemical machining process.

4. The method of claim 1, wherein said first conductivity-type ion implanted region disposed over the region adjacent to said transistor region is formed below the spacer of said gate electrode.

5. The method of claim 4, wherein said second conductivity-type ion implanted region disposed between said lower part of said transistor region and said first conductivity-type ion implanted region is formed between a channel region of said gate electrode and said first conductivity-type ion implanted region disposed below the spacer of said gate electrode.

6. The method of claim 1, wherein:
   said first conductivity-type ion implanted regions comprise N-type ion implanted regions; and said second conductivity-type ion implanted regions comprise P-type ion implanted regions.

7. The method of claim 6, wherein said N-type ion implanted regions are formed comprising implanting $P^+$ ions at a tilt.

8. The method of claim 7, wherein said $P^+$ ions comprise:
a dose between approximately 1E12 atoms/cm$^2$ to 5E13 atoms/cm$^2$; and
energy between approximately 50 KeV to 100 KeV.

9. The method of claim 7, wherein said implanting $P^+$ ions comprises a four-stage ion implantation process which is a technique of implanting ions having a quarter of the total dose four times in four directions while rotating the substrate.

10. The method of claim 6, wherein said P-type ion implanted regions are formed comprising implanting $BF^{2+}$ ions at a tilt.

11. The method of claim 10, wherein said $BF^{2+}$ ions comprise:
a dose between approximately 5E12 atoms/cm$^2$ to 5E13 atoms/cm$^2$; and
energy between approximately 50 KeV to 100 KeV.

12. The method of claim 10, wherein ion implantation comprises four stages.

13. The method of claim 1, wherein said second conductivity-type ion implanted regions comprise a greater depth relative to said first conductivity-type ion implanted regions.

14. The method of claim 1, wherein the photodiode is formed between said first conductivity-type ion implanted regions.

* * * * *